(12) United States Patent
Gabura et al.

(10) Patent No.: US 7,130,062 B2
(45) Date of Patent: Oct. 31, 2006

(54) RAPID-RESPONSE ELECTRON-BEAM DEPOSITION SYSTEM HAVING A CONTROLLER UTILIZING LEADING AND TRAILING DEPOSITION INDICATORS

(75) Inventors: Andrew James Gabura, Midland (CA); Geoffrey George Harris, Midland (CA)

(73) Assignee: Raytheon Company, Waltham, MA (US)

( * ) Notice: Subject to any disclaimer, the term of this patent is extended or adjusted under 35 U.S.C. 154(b) by 140 days.

(21) Appl. No.: 11/046,484

(22) Filed: Jan. 28, 2005

(65) Prior Publication Data
US 2006/0169920 A1  Aug. 3, 2006

(51) Int. Cl.
*G01B 11/28* (2006.01)
(52) U.S. Cl. ..................... 356/630; 356/632
(58) Field of Classification Search ............... 356/630, 356/632
See application file for complete search history.

(56) References Cited

U.S. PATENT DOCUMENTS

| | | | |
|---|---|---|---|
| 4,582,431 A * | 4/1986 | Cole | ........................ 356/632 |
| 4,669,873 A | 6/1987 | Wirz | |
| 4,671,613 A | 6/1987 | Buhrer | |
| 4,676,646 A * | 6/1987 | Strand et al. | ............... 356/632 |
| 5,009,485 A * | 4/1991 | Hall | ........................... 359/586 |
| 5,347,604 A | 9/1994 | Go et al. | |
| 5,455,673 A | 10/1995 | Alsmeyer et al. | |
| 5,526,121 A | 6/1996 | Sandifer et al. | |
| 6,815,653 B1 * | 11/2004 | Tsay et al. | ................. 250/206 |

OTHER PUBLICATIONS

Anon. "OMS 3000", Leybold Systems, 1998, pp. 1-1 to 1-5; pp. 2-1 to 2-9; p. 7-1.

* cited by examiner

*Primary Examiner*—Hwa (Andrew) Lee
*Assistant Examiner*—Roy M. Punnoose
(74) *Attorney, Agent, or Firm*—William C. Schubert; Karl A. Vick

(57) ABSTRACT

An electron-beam deposition system includes an evaporation source having a source target with a target location at which a deposition material may be positioned, and a controllable electron-beam source disposed to direct an electron beam at the target location. A trailing-indicator monitor measures a past evaporation performance of the evaporation source and has a trailing-indicator output, and a leading-indicator monitor measures a future evaporation performance of the evaporation source and has a leading-indicator output. A controller receives the trailing-indicator output and the leading-indicator output, and controls the electron-beam source responsive to the trailing-indicator output and to the leading-indicator output. Preferably, the trailing-indicator monitor measures a deposition of the deposition material on a monitored substrate, and the leading-indicator monitor measures a brightness of the deposition material in the evaporation source.

19 Claims, 3 Drawing Sheets

RAPID-RESPONSE ELECTRON-BEAM DEPOSITION SYSTEM HAVING A CONTROLLER UTILIZING LEADING AND TRAILING DEPOSITION INDICATORS

This invention relates to an electron-beam deposition system and, more particularly, to the control of the evaporation source in such a deposition system.

BACKGROUND OF THE INVENTION

Multilayer thin-film structures deposited upon a substrate are widely used in optical applications, such as in Fabry-Perot filters, and in microelectronic applications. The layers may be metals or inorganic nonmetals. In one approach to fabricating multilayer thin-film structures, several evaporation sources are placed into a vacuum chamber, with each evaporation source in a line of sight with a substrate. A plurality of thin layers of different compositions are deposited serially onto the substrate from the various evaporation sources.

Evaporatively unstable materials are particularly difficult to evaporate and deposit onto the substrate in a controlled manner. Such materials are unstable because, for example, they exhibit a rapid and/or nonlinear change in evaporation rate with power input, they sublime, or they have a small difference between the melting and boiling temperatures. Many important evaporatively unstable materials are inorganic nonmetals, such as glasses, ceramics, or semiconductors.

One common approach to depositing evaporatively unstable materials is to use thermal sources, wherein the evaporatively unstable material is placed into a crucible that is heated to a sufficiently high temperature to cause the evaporatively unstable material to evaporate and travel to the substrate. Such thermal sources are operable and highly useful in depositing thick films, but they are difficult to use in the transient conditions of thin-film deposition and with many evaporatively unstable materials.

An alternative is to use electron-beam evaporation. In an electron-beam deposition system, an evaporation source includes a deposition material and a controllable electron-beam source that directs an electron beam at the exposed surface of the deposition material. The electron beam heats the surface of the deposition material so that it progressively evaporates and is deposited upon the substrate. With time, the thickness of the deposit increases to a desired value. For thin-film deposition, electron-beam deposition has the advantage that the evaporation can be started and stopped rapidly through control of the beam power and location.

However, electron-beam deposition may be difficult to control, particularly for the deposition of evaporatively unstable materials such as some inorganic nonmetallic materials. The usual control approach is to continuously monitor the thickness of the film deposited upon a monitored substrate different from the substrate of the article of manufacture. The change in thickness is used to control the power input to the electron-beam source that determines the subsequent evaporation rate. Although successfully used for metallic materials, this approach has drawbacks for the deposition of evaporatively unstable materials. Such materials exhibit instabilities in the deposition process and the deposition rate, so that control based upon thickness measurements of the deposit on the monitored substrate may result in incorrect thicknesses on the article of manufacture.

There is a need for a better approach to the deposition of evaporatively unstable materials to produce thin-film structures. The present invention fulfills this need, and further provides related advantages.

SUMMARY OF THE INVENTION

The present invention provides an electron-beam deposition system with an improved controller that achieves highly precise control of the evaporation. This approach is operable with all evaporable materials, but is particularly advantageously employed to deposit evaporatively unstable nonmetallic materials such as potentially-unstable ceramics, glass, and semiconductors in multilayer thin films.

In accordance with the invention, an electron-beam deposition system comprises an evaporation source having a source target with a target location at which a deposition material may be positioned, and a controllable electron-beam source disposed to direct an electron beam at the target location. A trailing-indicator monitor measures a past evaporation performance of the evaporation source and has a trailing-indicator output. The trailing-indicator monitor is preferably a deposition monitor that measures a deposition of the deposition material on a monitored substrate. The electron-beam deposition system further includes a leading-indicator monitor that measures a future evaporation performance of the evaporation source and has a leading-indicator output. The leading-indicator monitor is preferably a brightness monitor that measures a brightness of the deposition material in the evaporation source. A controller receives the trailing-indicator output and the leading-indicator output, and controls the electron-beam source responsive to the trailing-indicator output and to the leading-indicator output. The controller preferably controls an electron-beam spot size and a position of the electron-beam at the target location. (The spot size is the area of the electron beam at the point of its impingement upon the target location.)

The deposition material is most beneficially applied to the deposition of an inorganic nonmetal such as a ceramic, a glass, or a semiconductor, although the approach is not so limited and is more generally applicable. Many such inorganic nonmetals are evaporatively unstable, so that the benefits of the present approach are greatest for these materials.

The controller preferably controls the electron-beam source responsive to a time rate of change of the leading-indicator output, rather than its absolute value. The time rate of change of the leading indicator is a sensitive measure of its near-term future value. The controller may optionally control the electron-beam source responsive to a logarithmic function of a time rate of change of the trailing-indicator output and/or a logarithmic function of the trailing-indicator output. The use of the logarithmic function, easily achieved through the use of a logarithmic amplifier, effectively linearizes the scale and permits stable control over wide ranges of the values.

The present approach may be implemented through the use of optical fiber techniques. In this approach, the electron-beam deposition system includes an optical fiber bundle having a first optical fiber subbundle and a second optical fiber subbundle. The trailing-indicator monitor includes the first optical fiber subbundle that receives a thickness optical signal from the monitored substrate responsive to a thickness of a deposit of the deposition material on the monitored substrate. The leading-indicator monitor includes the second optical fiber subbundle that receives an optical brightness signal responsive to a brightness of the deposition material in the evaporation source.

The present control approach is based on the use of both trailing and leading indicators of evaporation performance to control the electron-beam source of the evaporation source. The trailing indicator is preferably selected as the deposition rate of the evaporated deposition material on the monitored substrate. The information gained from this actual deposition rate represents the deposition rate at an earlier time, which lags the current deposition by ½ to 1 second. Although this lag time is not great, experience has shown that attempts to control the deposition of potentially unstable nonconductive nonmetals based upon just this trailing indicator lead to unsatisfactory results.

The present approach therefore uses the leading indicator as well. The leading indicator is a predictor of the deposition rate in the near future. The selected and preferred leading indicator is the brightness of the surface of the deposition material that is being evaporated. The brightness of the surface is a function of the temperature of the surface, and the evaporation rate from the surface is also a function of the temperature of the surface. Where the brightness is changing, the change in evaporation rate follows the brightness change slightly, so that the brightness change provides a leading indicator of the evaporation rate that will shortly be observed. Thus, by measuring the brightness of the surface, the subsequent evaporation rate may be predicted. By changing the brightness of the surface, the subsequent evaporation rate may be altered so as to maintain a set-point evaporation rate.

Stated alternatively, by using the trailing indicator for the absolute value of the deposition rate and the leading indicator for changes in the absolute value of the deposition rate, better control of the deposition rate is achieved. This control allows instabilities to be rapidly corrected, leading to a more stable evaporation system. Potentially unstable nonconductive materials may therefore be evaporated in a precisely controlled manner.

The controller preferably controls the spot size of the electron beam on the target. The spot size may be modulated rapidly and precisely, thereby achieving a dynamic variation in the evaporation rate. Decreasing the spot size without changing the power level increases the power density at the target location, increasing the evaporation rate disproportionately with the decrease in the spot size. Increasing the spot size decreases the evaporation rate in a comparable manner. Thus, while the power level of the electron beam may be changed, that change takes longer to have an effect on the evaporation rate than does the changing of the spot size. The use of the leading indicator and the trailing indicator in the control system, in conjunction with modulation of the electron beam spot size, allows the deposition of the deposition material to be controlled precisely even for evaporatively unstable materials.

Additionally, the controller preferably controls the location of the electron beam on the source target. One of the problems observed with conventional electron-beam deposition of some inorganic nonmetallic materials such as quartz is that it produces an irregular surface of the source target after a period of deposition. Ripples and other irregularities on the target surface, which are associated with evaporative instability, lead to variations in the rate and properties of the deposited layers. In the present approach, the location of the electron beam on the source target is moved to maintain a relatively flat surface on the source target. The resulting plume of evaporated material is therefore more stable than with prior approaches. The deposition surface is typically visible to the unaided eye so that the maintaining of surface form and flatness of the deposition surface may be verified. Quantitative techniques may also be used if desired. The source target may be mechanically rotated to aid in this control.

Other features and advantages of the present invention will be apparent from the following more detailed description of the preferred embodiment, taken in conjunction with the accompanying drawings, which illustrate, by way of example, the principles of the invention. The scope of the invention is not, however, limited to this preferred embodiment.

DETAILED DESCRIPTION OF THE INVENTION

Figure 1:
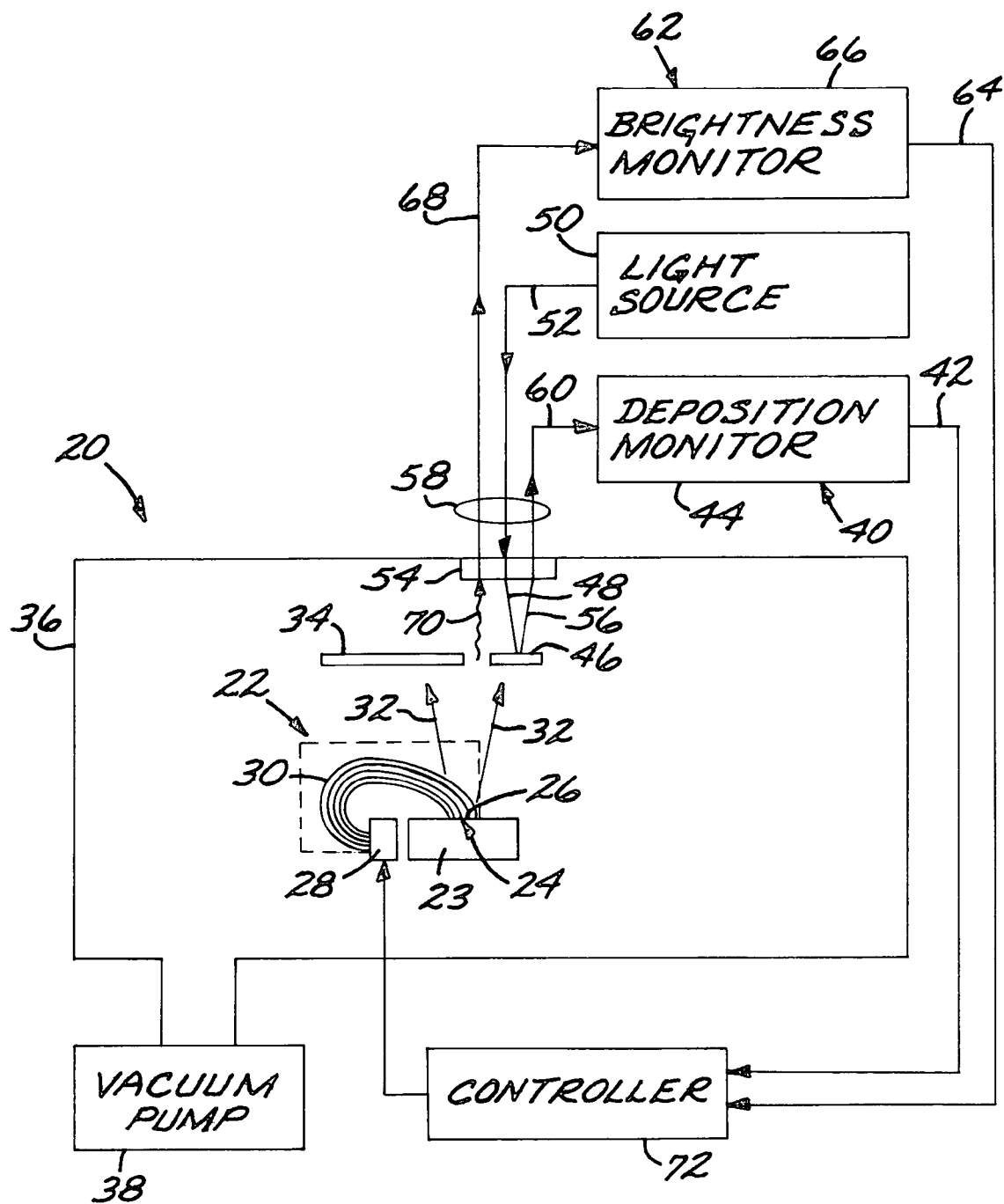
FIG. 1 is a schematic view of a first embodiment of an electron-beam deposition system according to the present approach.
Figure 2:
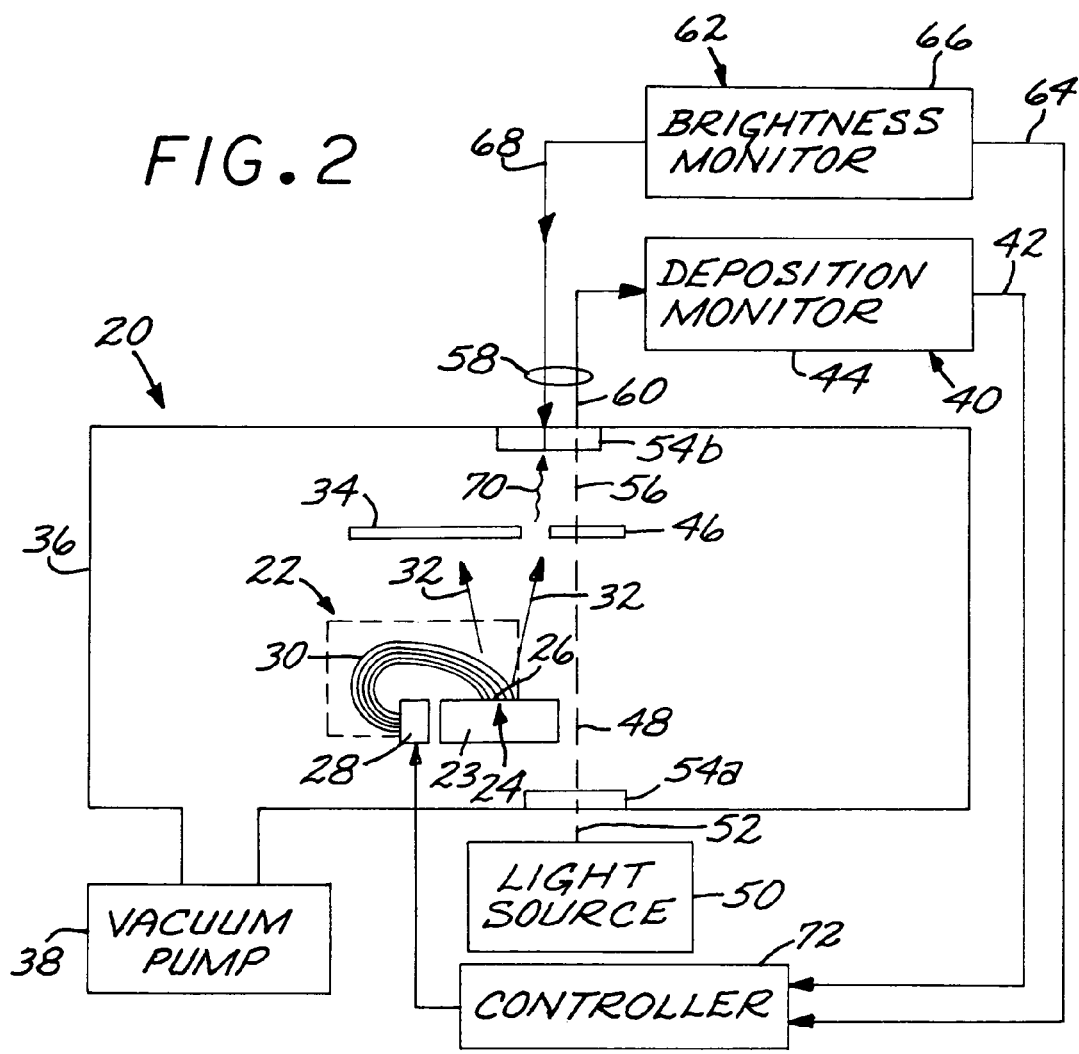
FIG. 2 is a schematic view of a second embodiment of an electron-beam deposition system according to the present approach.

FIGS. 1–2 depict two embodiments of an electron-beam deposition system 20. The two electron-beam deposition systems 20 are similar. The following description applies to both, except for differences that will be discussed herein.

An evaporation source 22 comprises a source target 23 having a target location 24 at which a deposition material 26 may be positioned. The deposition material 26 may be a metal or a nonmetal. It is preferred that the deposition material 26 is an inorganic nonmetal such as a ceramic, a glass, or a semiconductor. The present approach is applicable to both metals and nonmetals, and to electrical conductors and nonconductors, but its greatest advantages are realized where the deposition material 26 is an inorganic nonmetallic material and of relatively low electrical conductivity, since such materials tend to be the most susceptible to the evaporative instabilities during electron-beam deposition that are overcome by the present approach. The variation in electrical conductivity may cause problems where, as with silicon dioxide deposition material 26, the electrical conductivity is very low when the silicon dioxide is solid but suddenly becomes very high when evaporation starts. Low thermal conductivity causes problems as well, since there is limited pre-heating of nearby areas of the deposition material 26 prior to their evaporation. Such instabilities include, for example, large changes in evaporation rate with small changes in evaporation power level, and surface irregularities in the deposition material 26 at the target location 24 which lead to spatial irregularities in the deposited layers. In an application of most interest, the deposition material 26 is quartz, an inorganic nonmetal which is extremely useful and common in multilayer thin-film applications, but which is difficult to deposit by conventional electron-beam deposition techniques.

Figure 3:
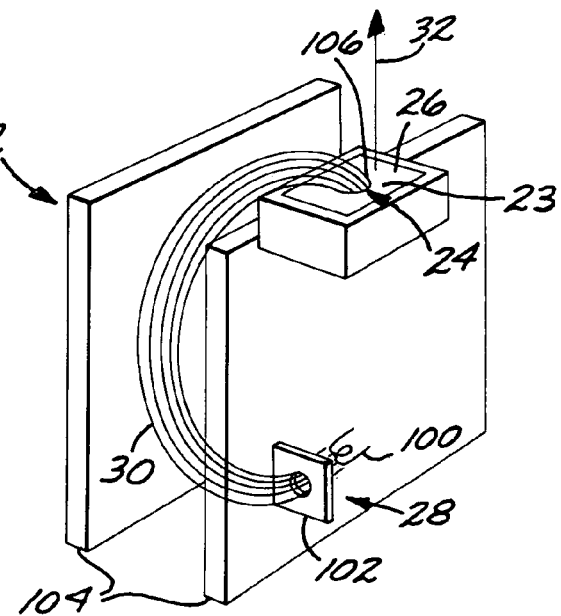
FIG. 3 is a perspective view of the evaporation source.

As shown in FIGS. 1–2 and in greater detail in FIG. 3, the evaporation source 22 further includes a controllable electron-beam source 28 disposed to direct an electron beam 30 at the target location 24 of the source target 23 and thence at the deposition material 26 when it is present at the target location 24. When the electron beam 30 of sufficient energy impinges upon the deposition material 26, a surface region of the deposition material 26 is heated and evaporated as a deposition beam 32 and deposits upon a substrate 34 (and elsewhere). As illustrated in FIG. 3, the electron-beam source 28 includes a controllable cathode filament 100 that is heated to produce electrons that are accelerated by the field of a controllable anode 102. The accelerated electron beam 30 is directed and shaped by a magnetic field produced by controllable electrical field plates 104. The electron beam 30 that passes through an aperture in the anode 102 is directed to the target location 24, in the illustrated type of electron-beam source 28 through an arc of 270 degrees, by the controllable electrical field plates 104. In other designs, the electron beam may be directed though an arc of 180 degrees or by some other amount. The shape and diameter of the electron beam 30 is also controlled by the field plates 104, to produce an electron-beam spot 106 on the target location 24 having an electron-beam spot size (i.e., spot area) at the target location 24. Thus, the field plates 104 may be controllably energized to control the location of the spot 106 and its spot size. Electron-beam sources 28 of this type are known in the art and are available commercially, examples being the ESV 14/Q Electron Beam Evaporator made by Leybold AG and the ESQ212 made by Balzers. However, such electron-beam sources 28 have not been previously controlled in the manner discussed herein.

The evaporation source 22 and the substrate 34 are enclosed in a vacuum chamber 36, which is evacuated by a vacuum pump 38.

The electron-beam deposition system 20 further includes a trailing-indicator monitor 40 that measures a past evaporation performance of the evaporation source 22 and has a trailing-indicator output 42. The trailing-indicator monitor 40 is preferably a deposition monitor 44 that measures a deposition of the deposition material 26 on a monitored substrate 46. The monitored substrate 46 is within the vacuum chamber 36 and positioned physically close to the substrate 34 so that the deposition beam 32 is incident upon the monitored substrate 46 as well as on the substrate 34. FIGS. 1 and 2 depict two different embodiments of the deposition monitor 44, either of which is satisfactory for use in the present approach.

The deposition monitor 44 of FIG. 1 is preferably, but not necessarily, an optical reflection type. A light beam 48 transmitted from a light source 50 over a source optical fiber 52 and through a feedthrough 54 is incident upon the monitored substrate 46. The light source 50 may be, for example, a non-coherent light source such as a tungsten-halogen bulb or a coherent light source such as an infrared laser. A reflected light beam 56 that reflects from the monitored substrate 46 is received by an optical fiber bundle 58, and specifically by a first optical fiber subbundle 60 that receives a thickness optical signal in the form of the reflected light beam 56 from the monitored substrate 46 and passes through the feedthrough 54. The amplitude of the reflected light beam 56 is responsive to a thickness of a deposit of the deposition material 26 on the monitored substrate 46, which serves as a surrogate for the thickness of the deposition material 26 on the substrate 34. After conversion to an electrical signal, signal conditioning, proper amplification, and normalization, the thickness signal becomes the trailing-indicator (i.e., deposition-rate) output 42.

The deposition monitor 44 of FIG. 2 is a transmission type. The same terminology and numbering of features will be used as in FIG. 1 for features with a comparable function in FIG. 2. The light beam 48 transmitted from the light source 50 over the source optical fiber 52 and through the feedthrough 54a is incident upon the monitored substrate 46. A transmitted light beam 56 that is transmitted through the monitored substrate 46 is received by the optical fiber bundle 58, and specifically by the first optical fiber subbundle 60 that receives the thickness optical signal in the form of the transmitted light beam 56 from the monitored substrate 46 and passes through a second feedthrough 54b. The amplitude of the transmitted light beam 56 is responsive to the thickness of the deposit of the deposition material 26 on the monitored substrate 46, which serves as a surrogate for the thickness of the deposition material 26 on the substrate 34. After signal conditioning, proper amplification, and normalization, the thickness signal becomes the trailing-indicator (i.e., deposition-rate) output 42.

Other types of deposition monitors 44 may be used as well to provide a measure of the past evaporation performance of the evaporation source. The deposition monitor 44 may, for example, sense the mass of the deposited material or the thickness of the deposited material by non-optical techniques.

The electron-beam deposition system 20 further includes a leading-indicator monitor 62 that measures a future evaporation performance of the evaporation source 22 and has a leading-indicator output 64. Preferably, the leading-indicator monitor 62 is a brightness monitor 66 that measures a brightness of the deposition material 26 in the evaporation source 22, which correlates with the temperature of the deposition material 26 in the evaporation source 22. When the temperature and thence the brightness of the deposition material 26 change, the deposition rate of the deposition beam 32 follows shortly thereafter. For example, when the temperature and the brightness of the deposition material 26 increase, the deposition rate of the deposition beam 32 shortly thereafter increases. In the preferred form, the leading-indicator monitor includes a second optical fiber subbundle 68 that receives an optical brightness signal 70 responsive to the brightness of the deposition material 26 in the evaporation source 22 and transmits that optical brightness signal 70 through the feedthrough 54 (FIG. 1) or 54b (FIG. 2) to the brightness monitor 66. After conversion to an electrical signal, signal conditioning, proper amplification, and normalization, the optical brightness signal 70 becomes the leading-indicator (i.e., brightness) output 64.

The optical brightness signal 70 may come directly from the heated surface of the deposition material 26 at the target location 24. More typically, however, the optical brightness signal 70 comes indirectly from the heated surface of the deposition material 26 at the target location 24, after one or more reflections from the walls and other structure within the vacuum chamber 36. As will be discussed subsequently, the rate of change of the optical brightness signal 70 is of interest rather than the absolute magnitude of the optical brightness signal 70, and therefore the use of a reflected optical brightness signal 70 is fully satisfactory. In many situations the reflected optical brightness signal 70 is preferred to a direct optical brightness signal 70, since this allows the second optical fiber subbundle 68 to be out of the deposition path of the deposition material 26.

The electron-beam deposition system 20 further includes a controller 72 which receives the trailing-indicator output 42 and the leading-indicator output 64, and controls the electron-beam source 28 responsive to the trailing-indicator output 42 and to the leading-indicator output 64. The controller 72 is illustrated in FIGS. 1 and 2, and its relationship with the other control elements is shown in greater detail in FIG. 4 for the preferred approach.

Figure 4:
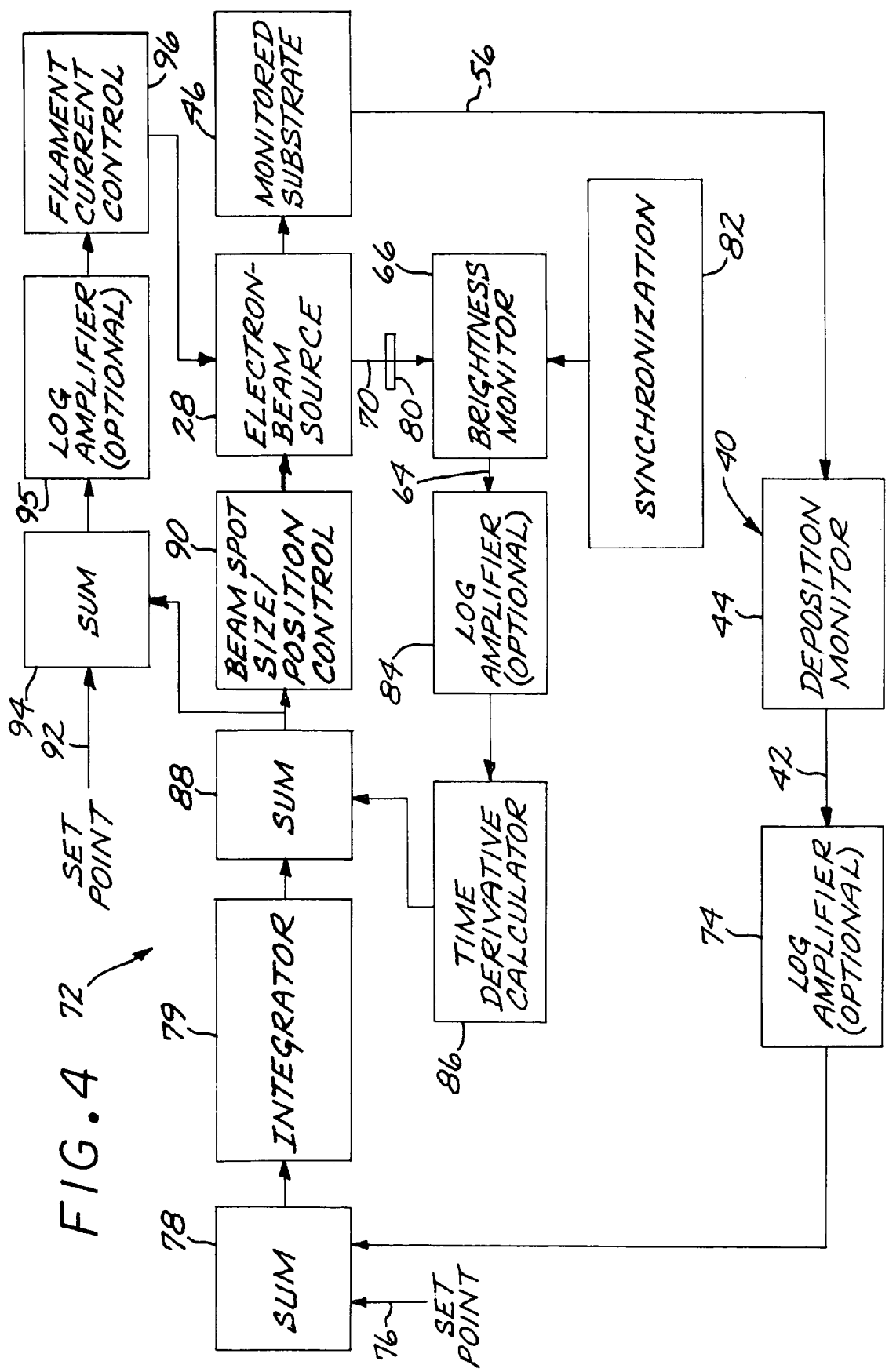
FIG. 4 is a block diagram of a control approach for the electron-beam deposition systems of FIGS. 1 and 2.

Referring to FIG. 4, there are three control loops. In a first or slow-response loop, the trailing-indicator output 42 from the deposition monitor 44 is optionally amplified by a logarithmic amplifier 74 to compress the output range. The logarithmic amplifier 74 may optionally be used because it is desirable to be able to operate the evaporator over a wide range (e.g., 1000:1) of deposition rates in order to achieve films of widely varying thicknesses. The logarithmic amplifier 74, where present, avoids major retuning of the control loop parameters after making a large rate change. The output of the logarithmic amplifier 74 (or of the deposition monitor 44, in the absence of the logarithmic amplifier 74) is summed with a setpoint input 76 at a summing junction 78. The sum is integrated over time by an integrator 79.

In a second or fast-response loop, the optical brightness signal 70 is optionally filtered by a filter 80 to remove infrared light (that is, passing visible light). The filter 80 is normally not needed when, for example, the optical thickness monitor uses a non-coherent light source 50 such as a tungsten-halogen bulb light source. The operation of the brightness monitor 66 is synchronized by a synchronization control 82 to operate when the deposition monitor 44 and its light source 50 are not operating, which effectively performs a filtering function on a non-coherent light source 50 such as a tungsten-halogen bulb. If an infrared laser were being used as the light source 50 for the optical thickness monitor, the filter 80 would desirably be used. Absent the filter 80 or the synchronization control 82, the intense light source 50 would potentially interfere with the operation of the brightness monitor 66, whose function is to monitor the brightness of the deposition material 26 in the target location 24 being heated by the electron beam 30. The leading-indicator output 64 is optionally amplified by a logarithmic amplifier 84 to compress the output range. The logarithmic amplifier 84 may be used because deposition rate is an exponential function of temperature (as measured by brightness). The time derivative of the output of the logarithmic amplifier 84 (or the brightness monitor 66, if the logarithmic amplifier 84 is not used) is calculated by a time-derivative calculator 86. The time-derivative of the brightness is summed with the output of the integrator 79 by a summing junction 88.

The summed signal output of the summing junction 88, which represents both the output signal of the first loop and the output signal of the second loop, is used to control the electron-beam source 28. Specifically, the output of the summing junction 88 controls the beam spot size through the beam spot size function of the beam spot size/position control 90. That is, the spot size of the electron beam 30 may be enlarged to reduce the temperature of the area of the deposition material 26 that is emitting, thereby reducing the mass of material in the deposition beam 32, or reduced to increase the temperature of the area of the deposition material 26 that is emitting, thereby increasing the mass of material in the deposition beam 32. This fast-response control of the rate of deposition, coupled with the monitoring obtained with the trailing-indicator monitor and the leading-indicator monitor, allows the deposition rate to be changed very rapidly in response to transient conditions of the deposition material 26. This fast-response capability allows evaporatively unstable, inorganic nonmetals, such as glasses, ceramics, or semiconductors to be deposited in a more stable and controllable manner than heretofore possible. Additionally, the center location of the spot 106 may be moved over the surface of the deposition material 26 using the beam position control function of the beam sport size/position control 90 so as to ensure that it will be evaporated uniformly, without the ridges and other surface irregularities that otherwise tend to make the deposition unstable.

The output of the summing junction 88 is also summed with the beam-diameter setpoint 92 at a summing junction 94 of a third control loop. The output of the summing junction is used to control the filament current control 96 that controls the current provided to the electron-beam source 28, either directly or through an optional logarithmic amplifier 95. The optional logarithmic amplifier 95 may be present because the deposition rate is exponentially dependent upon the filament current of the filament 100, and the optional logarithmic amplifier 95 linearizes the emission power control loop.

The optional use of the three logarithmic amplifiers 74, 84, and 95 allows the control loops to be made more linear in operation and thence more stable, particularly in circumstances where the deposition rate is to be controlled over several orders of magnitude (e.g., deposition rates of from 0.01 nanometers thickness per second to 10 nanometers thickness per second). One or more of the logarithmic amplifiers 74, 84, and 95 may be omitted if such a linearization is not necessary, as for example when the optimum system parameters are known and programmed as a function of deposition rate, or where the entire system is under computer control.

Although a particular embodiment of the invention has been described in detail for purposes of illustration, various modifications and enhancements may be made without departing from the spirit and scope of the invention. Accordingly, the invention is not to be limited except as by the appended claims.

What is claimed is:

1. An electron-beam deposition system, comprising:
   an evaporation source comprising
      a source target having a target location at which a deposition material may be positioned, and
      a controllable electron-beam source disposed to direct an electron beam at the target location;
   a trailing-indicator monitor that measures a past evaporation performance of the evaporation source and has a trailing-indicator output;
   a leading-indicator monitor that measures a future evaporation performance of the evaporation source and has a leading-indicator output; and
   a controller which receives the trailing-indicator output and the leading-indicator output, and controls the electron-beam source responsive to the trailing-indicator output and to the leading-indicator output.

2. The electron-beam deposition system of claim 1, wherein
   the trailing-indicator monitor is a deposition monitor that measures a deposition of the deposition material on a monitored substrate.

3. The electron-beam deposition system of claim 1, wherein
   the leading-indicator monitor is a brightness monitor that measures a brightness of the deposition material in the evaporation source.

4. The electron-beam deposition system of claim 1, further including
   the deposition material at the target location, wherein the deposition material is an inorganic nonmetal.

5. The electron-beam deposition system of claim 1, wherein the controller controls an electron-beam spot size of the electron-beam source.

6. The electron-beam deposition system of claim 1, wherein
the controller controls an electron-beam position of the electron-beam source.

7. The electron-beam deposition system of claim 1, wherein
the controller controls the electron-beam source responsive to a time rate of change of the leading-indicator output.

8. The electron-beam deposition system of claim 1, wherein
the controller controls the electron-beam source responsive to a logarithmic function of the leading-indicator output.

9. The electron-beam deposition system of claim 1, wherein
the controller controls the electron-beam source responsive to a logarithmic function of the trailing-indicator output.

10. The electron-beam deposition system of claim 1, wherein the electron-beam deposition system includes an optical fiber bundle having a first optical fiber subbundle and a second optical fiber subbundle,
wherein the trailing-indicator monitor includes the first optical fiber subbundle that receives a thickness optical signal from the monitored substrate responsive to a thickness of a deposit of the deposition material on the monitored substrate, and
wherein the leading-indicator monitor includes the second optical fiber subbundle that receives an optical brightness signal responsive to a brightness of the deposition material in the evaporation source.

11. An electron-beam deposition system, comprising:
an evaporation source comprising
a source target having a target location at which a deposition material may be positioned, and
a controllable electron-beam source disposed to direct an electron beam at the target location;
a deposition monitor that measures a deposition of the deposition material on a monitored substrate and has a deposition-rate output;
a brightness monitor that measures a brightness of the deposition material in the evaporation source and has a brightness output; and
a controller which receives the deposition-rate output and the brightness output, and controls the electron-beam source responsive to the deposition-rate output and to the brightness output, wherein the controller controls an electron-beam spot size of the electron-beam source.

12. The electron-beam deposition system of claim 11, further including
the deposition material at the target location, wherein the deposition material is an inorganic nonmetal.

13. The electron-beam deposition system of claim 11, wherein the deposition monitor comprises a deposit-thickness deposition monitor.

14. The electron-beam deposition system of claim 11, wherein the brightness monitor measures a reflected brightness of the deposition material.

15. The electron-beam deposition system of claim 11, wherein
the controller controls the electron-beam source responsive to a time rate of change of the brightness output.

16. The electron-beam deposition system of claim 11, wherein
the controller controls the electron-beam source responsive to a logarithmic function of the brightness output.

17. The electron-beam deposition system of claim 11, wherein
the controller controls the electron-beam source responsive to a logarithmic function of the deposition-rate output.

18. The electron-beam deposition system of claim 11, wherein
the controller controls an electron-beam position of the electron-beam source.

19. The electron-beam deposition system of claim 11, wherein the electron-beam deposition system includes an optical fiber bundle having a first optical fiber subbundle and a second optical fiber subbundle,
wherein the deposition monitor includes the first optical fiber subbundle that receives a thickness optical signal from the monitored substrate responsive to a thickness of a deposit of the deposition material on the monitored substrate, and
wherein the brightness monitor includes the second optical fiber subbundle that receives an optical brightness signal responsive to the brightness of the deposition material in the evaporation source.

* * * * *